United States Patent
Hirabayashi

(10) Patent No.: US 11,842,918 B2
(45) Date of Patent: Dec. 12, 2023

(54) WAFER CHUCK, METHOD FOR PRODUCING THE SAME, AND EXPOSURE APPARATUS

(71) Applicant: CANON KABUSHIKI KAISHA, Tokyo (JP)

(72) Inventor: Keiji Hirabayashi, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 313 days.

(21) Appl. No.: 17/037,386

(22) Filed: Sep. 29, 2020

(65) Prior Publication Data
US 2021/0104428 A1 Apr. 8, 2021

(30) Foreign Application Priority Data

Oct. 2, 2019 (JP) .................................. 2019-182530
Aug. 6, 2020 (JP) .................................. 2020-134003

(51) Int. Cl.
| H01L 21/687 | (2006.01) |
| H01L 21/683 | (2006.01) |
| G03F 7/00 | (2006.01) |
| C23C 16/02 | (2006.01) |
| C23C 16/27 | (2006.01) |
| C23C 16/458 | (2006.01) |

(52) U.S. Cl.
CPC .... H01L 21/68757 (2013.01); C23C 16/0272 (2013.01); C23C 16/27 (2013.01); C23C 16/458 (2013.01); G03F 7/707 (2013.01); H01L 21/6838 (2013.01)

(58) Field of Classification Search
CPC .......... H02L 21/68757; H02L 21/6838; C23C 16/458; C23C 16/27; C23C 16/0272
See application file for complete search history.

(56) References Cited

U.S. PATENT DOCUMENTS

| 5,119,541 A * | 6/1992 | Ohmi ................ H01L 21/68757 118/725 |
| 6,563,195 B1 * | 5/2003 | Tomaru ............. H01L 21/67132 349/122 |
| 9,721,821 B2 | 8/2017 | Lin |
| 2003/0064225 A1 | 4/2003 | Ohashi |
| 2005/0183669 A1 * | 8/2005 | Parkhe ............... H01L 21/6831 118/724 |
| 2010/0271745 A1 * | 10/2010 | Chen .................. H01L 21/6831 156/345.43 |
| 2021/0066107 A1 * | 3/2021 | Zhang ................ H01L 21/6833 |

FOREIGN PATENT DOCUMENTS

| CN | 101303531 A | 11/2008 |
| JP | H06204324 A | 7/1994 |
| JP | 2002047078 A | 2/2002 |
| JP | 2008-085283 A | 4/2008 |
| JP | 2016-157841 A | 9/2016 |
| JP | 2018-006573 A | 1/2018 |
| TW | 201923954 A | 6/2019 |
| WO | WO-2020216571 A1 * | 10/2020 ......... G03F 7/70691 |

\* cited by examiner

*Primary Examiner* — Seahee Hong
(74) *Attorney, Agent, or Firm* — Canon U.S.A., Inc., IP Division

(57) ABSTRACT

A wafer chuck includes a base made of a ceramic containing silicon carbide. The base has an oxidation-treated layer, and a film made of diamond-like carbon (DLC) is formed on an outermost surface of the base.

11 Claims, 2 Drawing Sheets

FIG. 1
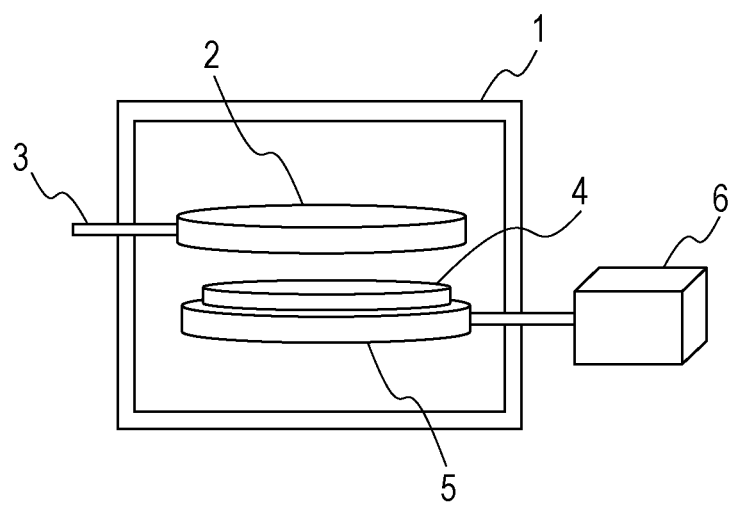
FIG. 2A
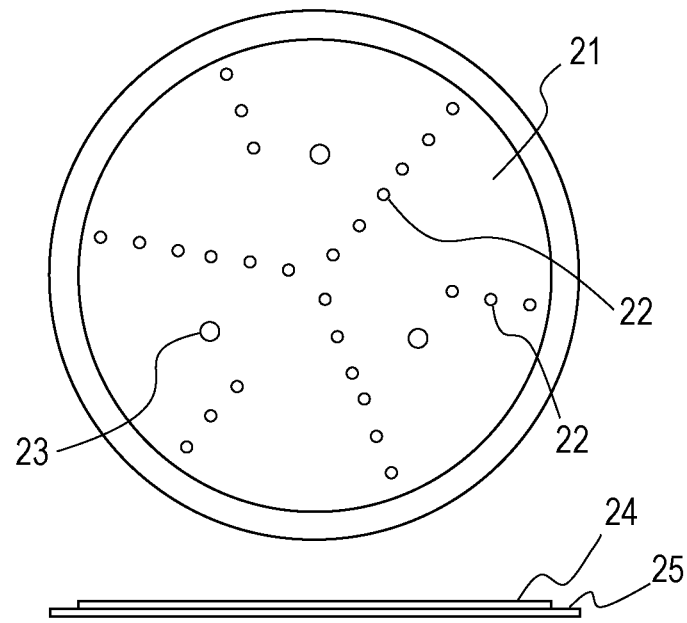
FIG. 2B

WAFER CHUCK, METHOD FOR PRODUCING THE SAME, AND EXPOSURE APPARATUS

BACKGROUND OF THE INVENTION

Field of the Invention

The disclosure relates to a wafer chuck member used to support a substrate in a lithography process step of producing a semiconductor device or the like.

Description of the Related Art

It is known that ceramic materials, such as silicon carbide ceramics and silicon nitride ceramics, are used as wafer chuck members used to support a substrate in a lithography process step of producing a semiconductor device. Among them, silicon carbide ceramics are resistant to durability degradation due to their high mechanical strength and have a smaller decrease in the positioning accuracy of a semiconductor wafer caused by a temperature change due to their high thermal conductivity. Thus, silicon carbide ceramics are suitable for wafer chuck members. When a silicon carbide member is ground or polished in a predetermined shape to be used as a wafer chuck material, however, it is known that fine microcracks appear on its surface, and fine silicon carbide ceramic particles separate as dusts from the fine microcracks. Such dusts (wastes) deposited on circuitry of a semiconductor device cause a circuit insulation failure, a short circuit, or another disadvantage.

Thus, it is known that a polycrystalline diamond film or a hard carbon film is formed on a surface of a wafer chuck to prevent dusting from the wafer chuck (Japanese Patent Laid-Open No. 6-204324).

In silicon carbide ceramics for use in motor components, it is also known that heat treatment at a temperature in the range of 400° C. to 1400° C. in the air or in an oxidizing atmosphere can reduce dusting (Japanese Patent Laid-Open No. 2002-47078). This is because heat treatment in the air or in an oxidizing atmosphere forms a surface film containing an oxide.

However, dusting is reduced only on a wafer chuck surface on which a polycrystalline diamond film or a hard carbon film is formed, and dusting cannot be reduced on a side surface or a back surface on which such a film is not formed.

Heat treatment of a silicon carbide ceramic at a temperature in the range of 400° C. to 1400° C. in the air or in an oxidizing atmosphere can reduce dusting. A surface film containing an oxide thus formed, however, has lower mechanical strength and a higher friction coefficient than silicon carbide ceramics. Lower durability of wafer chucks due to lower flatness caused by wear as well as dusting caused by wear are disadvantageous in members that require flatness on the order of nanometers, such as members for wafer chucks, though these are not great disadvantages in motor components. Although silicon carbide ceramic members have high wear resistance, sliding on wafer members for extended periods causes wear and compromises positioning accuracy or exposure performance, such as resolution.

SUMMARY OF THE INVENTION

A first aspect of the disclosure provides a wafer chuck comprising a base made of a ceramic containing silicon carbide, wherein the base has an oxidation-treated layer, and a film made of diamond-like carbon (DLC) is formed on its outermost surface of the base.

A second aspect of the disclosure a method of producing a wafer chuck comprises oxidation-treating a surface of a base made of a ceramic containing silicon carbide, and forming a film made of diamond-like carbon (DLC).

Further features of the disclosure will become apparent from the following description of exemplary embodiments with reference to the attached drawings.

BRIEF DESCRIPTION OF THE DRAWINGS

FIG. 1 is a schematic view of a film-forming apparatus according to the embodiment.

FIG. 2A is a schematic view of a wafer chuck according to the embodiment.

FIG. 2B is a schematic view of a wafer chuck according to the embodiment.

DESCRIPTION OF THE EMBODIMENTS

Figure 3A:
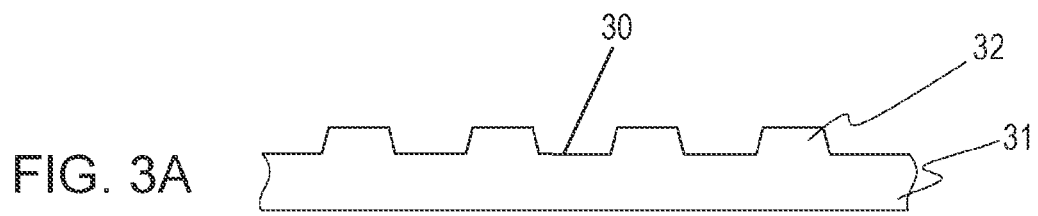
FIG. 3A is a schematic view of a wafer chuck according to the embodiment.

Embodiments of the disclosure are more specifically described below.

A wafer chuck is a member that holds a semiconductor wafer in a lithography process apparatus of a semiconductor device. A wafer chuck has projecting pin portions tens to hundreds of micrometers in height and diameter formed at intervals of hundreds of micrometers to a few millimeters on a surface of the wafer chuck with which a semiconductor wafer comes into contact. The wafer chuck also has holes and grooves for adsorbing the semiconductor wafer.

FIGS. 2A and 2B are schematic views of a wafer chuck for use in the embodiment. FIG. 2A is a top view, and FIG. 2B is a side view. A wafer chuck 21 has suction holes 22 passing through the wafer chuck 21 in the thickness direction. The suction holes 22 are used to suck a wafer (not shown), such as a silicon wafer. Although twenty-seven radially arranged suction holes 22 are illustrated in the figure, the size, number, and arrangement of the suction holes 22 may be adjusted to appropriately suck and fix a wafer on the chuck 21. After the completion of the lithography process of a wafer fixed to the chuck 21, the suction of the wafer is stopped, and lift pins (not shown) are raised through lift pin holes 23 from the back side of the chuck 21 to separate the wafer from the chuck 21. Although three circumferentially arranged lift pin holes 23 are illustrated in the figure, the size, number, and arrangement of the lift pin holes 23 may be adjusted to appropriately separate a wafer from the chuck 21. A silicon wafer is held on a top surface 24 of the wafer chuck 21. The projecting pin portions (not shown) are formed on the top surface 24. The wafer chuck 21 can be fixed to a wafer stage via a flange 25 of the wafer chuck 21.

Figure 3B:
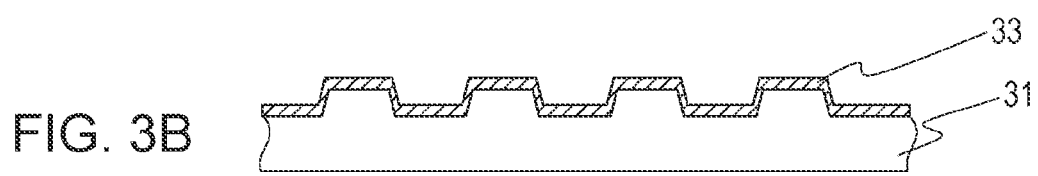
FIG. 3B is a schematic view of a wafer chuck according to the embodiment.
Figure 3C:
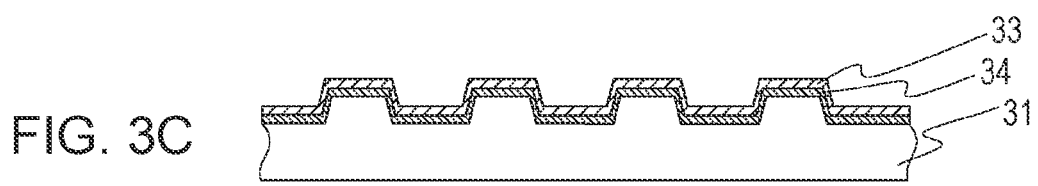
FIG. 3C is a schematic view of a wafer chuck according to the embodiment.

FIGS. 3A to 3C are schematic views of a diamond-like carbon film and an adhesive layer formed on a base. Projecting pin portions 32 are formed on a base 31. FIGS. 3A to 3C schematically illustrate the shape of the pin portions 32, and the height and width of the pin portions 32 and the distance between the pin portions 32 are not illustrated to scale. Correctly, as described above, pin portions typically have a height and a diameter of tens to hundreds of micrometers and are arranged at intervals of hundreds of micrometers to a few millimeters. In the embodiment, as illustrated in FIG. 3B, a film (diamond-like carbon film) 33 made of diamond-like carbon (DLC) can be formed on the entire front surface of the base 31 (the top surface, side surfaces, and bottom surface of the pin portions). Furthermore, in the embodiment, as illustrated in FIG. 3C, an adhesive layer 34 and the diamond-like carbon film 33 can be formed on the front surface of the base 31 in this order. Thus, the film made of diamond-like carbon (DLC) is formed on the outermost surface of the wafer chuck.

Figure 4:
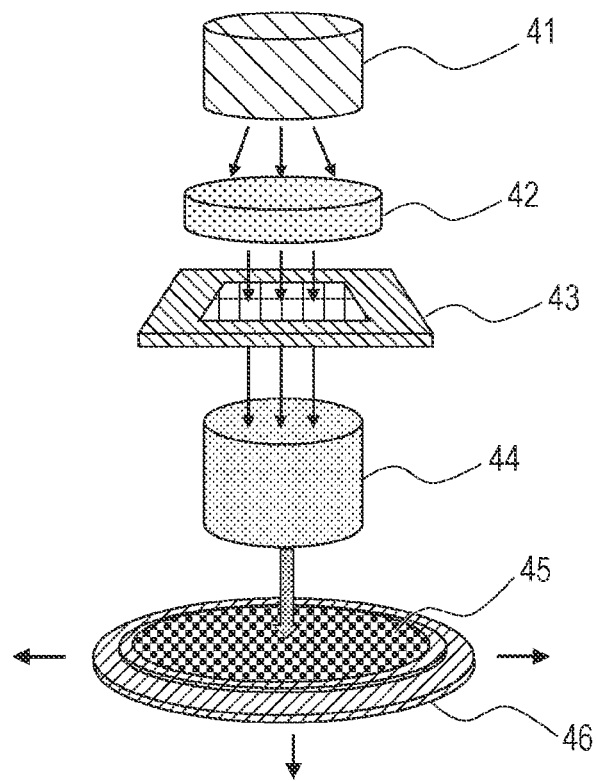
FIG. 4 is a schematic view of a lithography process in an exposure apparatus according to the embodiment.

FIG. 4 is a schematic view of a lithography process in an exposure apparatus, which is an example of an apparatus including a wafer chuck according to the embodiment. In the figure, an exposure light source 41 may be a mercury lamp, a laser source, such as KrF laser or ArF laser, or an X-ray light source. A condenser lens 42 can convert divergent light from the light source 41 into parallel light. A mask 43 has a desired circuit pattern of a wafer drawn on the surface of a quartz member or the like. A reduction projection lens 44 can reduce the circuit pattern drawn on the mask 43 and project it on a wafer 45. The wafer 45 may be made of silicon. The desired circuit pattern is drawn on a photoresist applied to the surface of the wafer 45 in the lithography process. A wafer chuck 46 is placed on a wafer stage (not shown) and can support the wafer 45, such as a silicon wafer. The wafer 45 and the wafer chuck 46 can be successively moved by the wafer stage, and the wafer 45 can be repeatedly exposed to a circuit pattern. In the schematic view of FIG. 4, the circuit pattern is formed in the lithography process using the light source (light). A wafer chuck according to the embodiment, however, may also be used in a process of transferring a micropattern of tens of nanometers or less by pressing an original mold, for example, in a nanoimprint process.

A wafer chuck according to the embodiment in an exposure apparatus can reduce dusting and improve durability by reducing wear.

The base used in the wafer chuck according to the present embodiment can have a specified shape, for example, by forming a ceramic material containing silicon carbide in a pin shape on a surface of the wafer chuck with which a semiconductor wafer comes into contact.

A ceramic containing silicon carbide used in the embodiment is a sintered body or polycrystal of silicon carbide. A dense sintered body can be formed by using beryllium (Be), boron (B), aluminum (Al), and/or a compound (carbide, nitride, oxide) thereof as a sintering aid in addition to the silicon carbide component. A silicon carbide polycrystal can be formed by a chemical vapor deposition (CVD) method. More specifically, for example, a single body of a polycrystalline silicon carbide member can be produced by forming a silicon carbide polycrystal a few millimeters in thickness from silicon tetrachloride gas and methane gas on a graphite base by a thermal CVD method and removing the graphite base by cutting or by vaporization at high temperature. Containing no sintering aid, the polycrystalline silicon carbide member formed by the CVD method has higher purity than sintered bodies and has high adhesiveness to a diamond-like carbon film to be formed. The polycrystalline silicon carbide member is suitable for a wafer chuck member due to its high mechanical strength and thermal conductivity. Sintered bodies composed mainly of silicon carbide and polycrystalline silicon carbide members formed by the CVD method are referred to as ceramics containing silicon carbide (silicon carbide ceramics) in the embodiment.

A wafer chuck should have high flatness particularly in pin-shaped portions on a surface of the wafer chuck with which a semiconductor wafer comes into contact. When a base is ground or polished in a predetermined shape, fine microcracks appear on its surface, and fine silicon carbide ceramic particles separate as dusts (wastes) from the fine microcracks. Such dusts deposited on circuitry of a semiconductor device sometimes cause a circuit insulation failure or a short circuit.

To solve the disadvantages, in the present embodiment, a surface of a base made of a ceramic containing silicon carbide is first subjected to oxidation treatment. More specifically, for example, the base is heated at a temperature in the range of 300° C. to 700° C. in the air or in an oxygen atmosphere for tens of minutes to tens of hours. This oxidizes a microcrack portion on the surface and forms a film containing an oxide (an oxidation-treated layer) 30. The film containing an oxide (oxidation-treated layer) 30 has a thickness in the range of approximately 1 to 100 nm. The oxygen atom concentration in the film containing an oxide (oxidation-treated layer) 30 is more than 25 atomic percent. In other words, the oxidation-treated layer has an oxygen atom concentration of more than 25 atomic percent. The oxygen atom concentration in the film can be measured with an elemental analyzer of an electron microscope. The oxygen atom concentration of the oxidation-treated layer tends to increase with treatment temperature and treatment time.

Ceramic materials containing silicon carbide typically have high thermal stability and are rarely oxidized at a temperature in the range of approximately 300° C. to 700° C. A microcrack portion formed by grinding or polishing, however, has high reactivity due to a defect or distortion caused by the processing and may be easily oxidized at low temperatures. A film containing an oxide formed in a microcrack portion increases the volume of a crack surface portion and covers the microcrack portion, thereby reducing the separation of fine particles from the surface. A higher oxidation treatment temperature typically results in a thicker film containing an oxide and a higher anti-dusting effect. An oxidation treatment temperature of, for example, 1000° C. or more, however, sometimes causes thermal deformation and results in a wafer chuck with insufficient flatness. Thus, it is desirable that the oxidation treatment temperature be as low as 300° C. to 700° C. and the treatment time be longer (desirably a few hours or more). The optimum oxidation treatment conditions for a ceramic sintered body containing silicon carbide depend on the particle size before sintering, the sintering state, the type of sintering aid, and the grinding or polishing conditions. Thus, these conditions are appropriately controlled. The optimum oxidation treatment conditions for a polycrystalline silicon carbide member formed by the CVD method also depend on the average particle size of the polycrystal and the grinding or polishing conditions. Thus, these conditions are also appropriately controlled.

After the oxidation treatment, a film made of diamond-like carbon (DLC) (a diamond-like carbon film) is formed.

It is known that diamond-like carbon films are typically coating materials that have high film stress and are easily separated, but diamond-like carbon films have relatively high adhesiveness to silicon carbide members.

In ceramic sintered bodies containing silicon carbide, however, an oxidized layer is formed on the surface of the sintering aid under certain oxidation treatment conditions. This sometimes causes the disadvantages of poor adhesion between a diamond-like carbon film and a ceramic member containing silicon carbide and the separation of the diamond-like carbon film. This is because the sintering aid material is more easily oxidized than silicon carbide materials. Thus, also to improve the adhesiveness of a diamond-like carbon film, it is desirable that the oxidation treatment temperature be as low as 300° C. to 700° C. Under these oxidation treatment conditions, the amount of sintering aid in a ceramic sintered body containing silicon carbide is generally as small as a few percent or less by weight, and the adhesiveness to a diamond-like carbon film is at a practical level.

A polycrystalline silicon carbide member formed by the CVD method, which contains no sintering aid, is free from oxidation of the sintering aid portion and has a smaller decrease in adhesiveness to a diamond-like carbon film resulting from oxidation treatment. This is probably because the oxidation of a crack portion in oxidation treatment is mainly caused by a reaction within silicon carbide crystal grains, and a surface portion with which a diamond-like carbon film comes into contact rarely has an oxidized portion. Also in this respect, the polycrystalline silicon carbide member formed by the CVD method is suitable for the base.

After the formation of a layer containing at least silicon or carbon, a diamond-like carbon film can be formed on the layer containing at least silicon or carbon to improve adhesiveness. In other words, a layer containing at least silicon or carbon and a film made of diamond-like carbon (a diamond-like carbon film) can be sequentially stacked.

After the formation of an amorphous layer containing carbon, silicon, oxygen, and hydrogen, a diamond-like carbon film can also be formed on the amorphous layer containing carbon, silicon, oxygen, and hydrogen to improve adhesiveness. In other words, an amorphous layer containing carbon, silicon, oxygen, and hydrogen and a diamond-like carbon film can be sequentially stacked.

The layer containing at least silicon or carbon or the amorphous layer containing carbon, silicon, oxygen, and hydrogen is referred to as an adhesive layer. The adhesive layer is formed to further improve adhesion between a silicon carbide ceramic member and a diamond-like carbon film.

A layer containing at least silicon or carbon in the embodiment includes a silicon film, a silicon nitride film, or a carbide film, such as a silicon carbide film or a carbon nitride film. Although the layer containing at least silicon or carbon may contain oxygen, the oxygen content is 25 atomic percent or less, desirably 20 atomic percent or less.

The amorphous layer containing carbon, silicon, oxygen, and hydrogen is suitable for an adhesive layer due to its high adhesiveness to a diamond-like carbon film and small film stress. Each of the carbon, silicon, oxygen, and hydrogen atom concentrations in the film can be 5 atomic percent or more, and the oxygen atom concentration can be 20 atomic percent or less. The concentration of each element in the film can be measured with an elemental analyzer of an electron microscope.

FIG. 1 illustrates a film-forming apparatus for forming the adhesive layer and a diamond-like carbon film. The film-forming apparatus illustrated in FIG. 1 is a high-frequency plasma chemical vapor deposition (CVD) apparatus. A film-forming apparatus used in the present embodiment is not limited to this, and a known ion plating apparatus or sputtering apparatus may also be used. Although the film-forming apparatus in the present embodiment can successively form the adhesive layer and a diamond-like carbon film, the adhesive layer and the diamond-like carbon film may be formed with different apparatuses. For example, the adhesive layer may be formed with a high-frequency plasma CVD apparatus as illustrated in FIG. 1, and a diamond-like carbon film may be formed with another apparatus, such as an ion plating apparatus, a sputtering apparatus, or a cathode arc film-forming apparatus. Alternatively, after the adhesive layer is formed with a sputtering apparatus, a diamond-like carbon film may be formed with the high-frequency plasma CVD apparatus illustrated in FIG. 1.

In FIG. 1, a vacuum chamber 1 is equipped with a vacuum pump (not shown) and a vacuum valve (not shown) and can be evacuated to $1 \times 10^{-3}$ Pa. A ground electrode 2 also serving as a raw material gas introduction showerhead has many openings approximately 1 mm in diameter on its bottom surface in the figure. The raw material gas can be introduced through the openings. The diameter and pitch of the openings are appropriately determined to make the thickness distribution of a film to be formed uniform. The ground electrode 2 also serving as a raw material gas introduction showerhead is also used as a ground electrode. A raw material gas inlet 3 is coupled to a gas valve, a gas flow controller, and a raw material gas cylinder (all not shown).

To form an amorphous layer containing carbon, silicon, oxygen, and hydrogen with the apparatus, for example, a liquid organosilicon compound can be used as a raw material gas. The liquid organosilicon compound can be used by heating tetraethoxysilane or hexamethyldisiloxane (for example, approximately 40° C.) for gasification. These gases may also be diluted with a noble gas (argon gas, helium gas, etc.), nitrogen gas, or hydrogen gas.

Various carbon-containing gases and liquid organic compounds subjected to vaporization can be used as raw material gases for a diamond-like carbon film. Examples of the carbon-containing gases include hydrocarbon gases, such as methane, ethane, ethylene, and acetylene, carbon monoxide, and halogenated carbons. Examples of the liquid organic compounds include alcohols, such as methanol and ethanol, ketones, such as acetone, aromatic hydrocarbons, such as benzene and toluene, ethers, such as dimethyl ether, and organic acids, such as formic acid and acetic acid. These gases may also be diluted with a noble gas (argon gas, helium gas, etc.), nitrogen gas, or hydrogen gas. A base 4 is produced by processing a base made of a ceramic containing silicon carbide in a specified shape and subjecting the base to the oxidation treatment. The base 4 can be placed on a high-frequency introduction electrode 5 also serving as a substrate holder. The high-frequency introduction electrode 5 can also be used to apply high-frequency power. A high-frequency power supply 6 supplies high-frequency power to the high-frequency introduction electrode 5 also serving as a substrate holder.

To form a film containing at least silicon as an adhesive layer, for example, a silicon target can be sputtered by a known sputtering method to form a silicon film. A gas mixture of argon and nitrogen can be used as a sputtering gas to form a silicon nitride film. A silicon carbide target can also be sputtered to form a silicon carbide film.

In the amorphous layer containing carbon, silicon, oxygen, and hydrogen used as an adhesive layer, each of the carbon, silicon, oxygen, and hydrogen atom concentrations is at least 5 atomic percent. The oxygen atom concentration is 20 atomic percent or less. The amorphous layer containing carbon, silicon, oxygen, and hydrogen is also referred to as a C—Si—O—H film. Incidental impurities in the formation of the film may be approximately 1 atomic percent or less of a diluent gas, such as nitrogen or argon, or a metallic element of the chamber and substrate holder, such as iron or aluminum. The amorphous layer containing carbon, silicon, oxygen, and hydrogen in the present embodiment is formed between the ceramic base containing silicon carbide and a diamond-like carbon film and is used as an intermediate layer to improve adhesiveness. Carbon and silicon in the layer improve adhesiveness, and hydrogen and oxygen in the layer reduce film stress and further improve adhesiveness. Adhesiveness is improved at an oxygen atom concentration of 20 atomic percent or less, and adhesiveness to a diamond-like carbon film is sometimes not improved at an oxygen atom concentration of more than 25 atomic percent. The amorphous layer containing carbon, silicon, oxygen, and hydrogen can be an amorphous film without crystallinity.

The thickness of the adhesive layer can be appropriately adjusted and ranges from, for example, 0.01 μm or more and 1 μm or less, desirably 0.02 μm or more and 0.4 μm or less.

A film made of diamond-like carbon (DLC) (a diamond-like carbon film) is thus called because it is basically amorphous, has high hardness, and has high transparency in the infrared region. A film made of diamond-like carbon (DLC) (a diamond-like carbon film) is sometimes referred to as a hard carbon film, an i-C film (i-carbon film), or a ta-C film (tetrahedral amorphous carbon film). A film made of diamond-like carbon (DLC) (a diamond-like carbon film) is composed only of carbon atoms and incidental impurities or contains hydrogen gas generated from a raw material. The film containing hydrogen gas is sometimes referred to as an a-C:H film. A diamond-like carbon film according to the embodiment includes the a-C:H film. Incidental impurities may be approximately 1 atomic percent or less of a diluent gas, such as nitrogen, argon, or atmospheric oxygen, or a metallic element of the chamber and substrate holder, such as iron or aluminum. The thickness of the film can be appropriately adjusted and ranges from, for example, 0.04 μm or more and 1 μm or less, desirably 0.05 μm or more and 0.4 μm or less.

EXAMPLES

The disclosure is described in detail in the following exemplary embodiments.
Evaluation of Amount of Dust In the present exemplary embodiments, the amount of dust in a wafer chuck was evaluated by the following method. A base made of a ceramic containing silicon carbide ground in a specified shape was placed on a clean bench, and surrounding air was introduced by suction into a particle counter to measure dust 0.1 μm or more in size. The amount of dust was based on the amount of dust in Comparative Example 1, in which a base made of a ceramic sintered body containing silicon carbide was not subjected to oxidation treatment and no adhesive layer and no diamond-like carbon film were formed. The amounts of dust in the exemplary embodiments and the other comparative examples were compared.
Evaluation of Durability Durability was evaluated by a pin-on-disk method in a sliding test. Samples were prepared by grinding a material equivalent to a base made of a ceramic containing silicon carbide in a flat sheet shape and subjecting the material to various treatments described in the exemplary embodiments and comparative examples. While a φ8 silicon sphere was placed on a sample under a load of 50 g, a test was performed at a width of 5 mm and at a sliding rate of 1 mm/s. After the test, the slide portion was checked for a sliding wear scar with an optical microscope or a scanning electron microscope. A sample including a film was checked for the separation of the film with an optical microscope or a scanning electron microscope. The wear scar shape was determined with an interferometer that can observe the surface profile.

Exemplary Embodiment 1

First, a base made of a ceramic sintered body containing silicon carbide ground in a specified shape was placed in a furnace and was subjected to oxidation treatment. The base was heated to 400° C. at a heating rate of 10° C./min in the air, was maintained at 400° C. for 5 hours, and was then slowly cooled to room temperature over 8 hours. The base made of a ceramic sintered body containing silicon carbide was then placed in a high-frequency plasma CVD apparatus as illustrated in FIG. 1, which was evacuated to $1 \times 10^{-3}$ Pa with a vacuum pump. Argon gas for plasma cleaning was then introduced into the raw material gas introduction showerhead 2, and the pressure was adjusted to be 5 Pa. High-frequency power was then applied from the high-frequency power supply 6 to the substrate holder 5 at 450 W to generate plasma, which was used to clean the surface of the base 4 (to remove water and contamination). The argon gas was then stopped, and the apparatus was evacuated to $1 \times 10^{-3}$ Pa with a vacuum pump. Toluene to be used to form a diamond-like carbon film was then introduced into the raw material gas introduction showerhead 2, and the pressure was adjusted to be 5 Pa. High-frequency power was then applied from the high-frequency power supply 6 to the substrate holder 5 at 450 W to generate plasma. A 100-nm diamond-like carbon film (DLC film) was formed on the surface of the base 4.

A diamond-like carbon film for analytical evaluation was separately formed on a silicon base under the same conditions as in the present exemplary embodiment. The analysis showed that the diamond-like carbon film was composed of carbon and hydrogen at C:H=75.3:24.7 based on atomic percent and had a hardness of 20 GPa.

The amount of dust in the wafer chuck was measured by the above specified method. In the same manner as in the present exemplary embodiment, a ceramic sintered body containing silicon carbide was subjected to oxidation treatment, and a diamond-like carbon film was formed on the ceramic sintered body to prepare a φ60 flat sheet sample. The flat sheet sample was examined by the pin-on-disk method in the sliding test. After the test, the flat sheet sample was checked for a sliding wear scar and film separation with an optical microscope and a scanning electron microscope. Table 1 shows the evaluation results.

Exemplary Embodiment 2

A base made of polycrystalline silicon carbide formed by the CVD method ground in a specified shape was subjected to oxidation treatment in a furnace. The base was heated to 450° C. at a heating rate of 5° C./min in the air, was maintained at 450° C. for 10 hours, and was then slowly cooled to room temperature over 12 hours. The base made of polycrystalline silicon carbide formed by the CVD method was then placed in a high-frequency plasma CVD apparatus as illustrated in FIG. 1, which was evacuated to $1 \times 10^{-3}$ Pa with a vacuum pump. Argon gas for plasma cleaning was then introduced into the raw material gas introduction showerhead 2, and the pressure was adjusted to be 5 Pa. High-frequency power was then applied from the high-frequency power supply 6 to the substrate holder 5 at 450 W to generate plasma, which was used to clean the surface of the base 4. Toluene to be used to form a diamond-like carbon film was then introduced into the raw material gas introduction showerhead 2, and the pressure was adjusted to be 5 Pa. High-frequency power was then applied from the high-frequency power supply 6 to the substrate holder 5 at 600 W to generate plasma. A 150-nm diamond-like carbon film (DLC film) was formed on the surface of the base 4.

A diamond-like carbon film for analytical evaluation was separately formed on a silicon base under the same conditions as in the present exemplary embodiment. The analysis showed that the diamond-like carbon film was composed of carbon and hydrogen at C:H=80.5:19.5 based on atomic percent and had a hardness of 22 GPa.

The amount of dust in the wafer chuck was measured by the above specified method. In the same manner as in the present exemplary embodiment, a diamond-like carbon film was formed on a $\phi$60 flat sheet sample made of the CVD polycrystalline silicon carbide to prepare a sample. The flat sheet sample was examined by the pin-on-disk method in the sliding test. After the test, the flat sheet sample was checked for a sliding wear scar and film separation with an optical microscope and a scanning electron microscope. Table 1 shows the dusting test and sliding evaluation results.

Exemplary Embodiment 3

First, a base made of a ceramic sintered body containing silicon carbide ground in a specified shape was placed in a furnace and was subjected to oxidation treatment. The base was heated to 400° C. at a heating rate of 10° C./min in the air, was maintained at 400° C. for 5 hours, and was then slowly cooled to room temperature over 8 hours. The base made of a ceramic containing silicon carbide was placed in a high-frequency plasma CVD apparatus as illustrated in FIG. 1, which was evacuated to $1\times10$ Pa with a vacuum pump. Argon gas for plasma cleaning was then introduced into the raw material gas introduction showerhead 2, and the pressure was adjusted to be 5 Pa. High-frequency power was then applied from the high-frequency power supply 6 to the substrate holder 5 at 450 W to generate plasma, which was used to clean the surface of the base 4. To form an amorphous layer containing carbon, silicon, oxygen, and hydrogen, a raw material gas hexamethyldisiloxane was introduced into the vacuum chamber 1 through the raw material gas introduction showerhead 2, and the pressure was adjusted to be 5 Pa. High-frequency power was then applied from the high-frequency power supply 6 to the substrate holder 5 at 450 W to generate plasma. An 80-nm amorphous layer containing carbon, silicon, oxygen, and hydrogen was formed on the surface of the base 4. The introduction of hexamethyldisiloxane was then stopped. After the vacuum chamber 1 was evacuated to $1\times10^{-3}$ Pa with a vacuum pump, toluene to be used to form a diamond-like carbon film was introduced into the raw material gas introduction showerhead 2. The pressure was adjusted to be 5 Pa. High-frequency power was then applied from the high-frequency power supply 6 to the substrate holder 5 at 450 W to generate plasma. A 100-nm diamond-like carbon film (DLC film) was formed on the amorphous layer containing carbon, silicon, oxygen, and hydrogen.

An amorphous monolayer containing carbon, silicon, oxygen, and hydrogen and a diamond-like carbon monolayer for analytical evaluation were separately formed on a silicon base under the same conditions as in the present exemplary embodiment. The analysis showed that the amorphous layer containing carbon, silicon, oxygen, and hydrogen had a composition of C:Si:O:H=40.5:13.0:11.1:35.4 based on atomic percent. The analysis also showed that the diamond-like carbon film was composed of carbon and hydrogen at C:H=75.3:24.7 based on atomic percent and had a hardness of 20 GPa.

The amount of dust in the wafer chuck was measured by the above specified method. In the same manner as in the present exemplary embodiment, a ceramic containing silicon carbide was subjected to oxidation treatment, and an amorphous layer containing carbon, silicon, oxygen, and hydrogen and a diamond-like carbon film were formed on the ceramic to prepare a $\phi$60 flat sheet sample. The flat sheet sample was examined by the pin-on-disk method in the sliding test. After the test, the flat sheet sample was checked for a sliding wear scar and film separation with an optical microscope and a scanning electron microscope. Table 1 shows the evaluation results.

Exemplary Embodiment 4

A base made of a ceramic sintered body containing silicon carbide ground in a specified shape was placed in a furnace, and for oxidation treatment was heated to 600° C. at a heating rate of 10° C./min in the air, was maintained at 600° C. for 3 hours, and was then slowly cooled to room temperature over 8 hours. The base made of a ceramic sintered body containing silicon carbide was then placed in a high-frequency plasma CVD apparatus as illustrated in FIG. 1, which was evacuated to $1\times10^{-3}$ Pa with a vacuum pump. To form an amorphous layer containing carbon, silicon, oxygen, and hydrogen, raw material gases, hexamethyldisiloxane and argon gas at a ratio of 1:5, were introduced into the vacuum chamber 1 through the raw material gas introduction showerhead 2, and the pressure was adjusted to be 6 Pa. High-frequency power was then applied from the high-frequency power supply 6 to the substrate holder 5 at 600 W to generate plasma. A 50-nm amorphous layer containing carbon, silicon, oxygen, and hydrogen was formed on the surface of the base 4. The introduction of hexamethyldisiloxane and argon gas was then stopped. After the apparatus was evacuated to $1\times10^{-3}$ Pa with a vacuum pump, toluene and argon gas at a ratio of 1:5 to be used to form a diamond-like carbon film was introduced into the raw material gas introduction showerhead 2, and the pressure was adjusted to be 4 Pa. High-frequency power was then applied from the high-frequency power supply 6 to the substrate holder 5 at 650 W to generate plasma. A 100-nm diamond-like carbon film (DLC film) was formed on the amorphous layer containing carbon, silicon, oxygen, and hydrogen.

An amorphous layer containing carbon, silicon, oxygen, and hydrogen and a diamond-like carbon film for analytical evaluation were separately formed on a silicon base under the same conditions as in the present exemplary embodiment. The analysis showed that the amorphous layer containing carbon, silicon, oxygen, and hydrogen had a composition of C:Si:O:H=35.4:20.6:9.0:35.0 based on atomic percent. The analysis showed that the diamond-like carbon film was composed of carbon and hydrogen at C:H=78.0:22.0 based on atomic percent and had a hardness of 21 GPa.

The amount of dust in the wafer chuck was measured by the above specified method. In the same manner as in the present exemplary embodiment, a ceramic containing silicon carbide was subjected to oxidation treatment, and an amorphous layer containing carbon, silicon, oxygen, and hydrogen and a diamond-like carbon film were formed on the ceramic to prepare a $\phi$60 flat sheet sample. The flat sheet sample was examined by the pin-on-disk method in the sliding test. After the test, the flat sheet sample was checked for a sliding wear scar and film separation with an optical microscope and a scanning electron microscope. Table 1 shows the evaluation results.

Comparative Example 1

A base made of a ceramic sintered body containing silicon carbide ground in a specified shape in the same manner as in Exemplary Embodiment 1 was not subjected to oxidation treatment, and no adhesive layer and no diamond-like carbon film were formed on the base. The amount of dust in the base was measured by the specified method. A φ60 flat sheet sample of a ceramic containing silicon carbide was prepared without oxidation treatment and without the formation of the adhesive layer and the diamond-like carbon film. The sample was examined by the pin-on-disk method in the sliding test. After the test, the sample was checked for a sliding wear scar with an optical microscope and a scanning electron microscope. Table 1 shows the evaluation results.

Comparative Example 2

In Comparative Example 2, a base made of a ceramic sintered body containing silicon carbide ground in a specified shape in the same manner as in Exemplary Embodiment 1 was subjected to heat treatment (400° C.) in the same manner as in Exemplary Embodiment 1. No adhesive layer and no diamond-like carbon film (DLC film) were formed in the present comparative example. The amount of dust was measured by the specified method in the same manner as in Exemplary Embodiment 1. A φ60 flat sheet sample of a silicon carbide ceramic only subjected to oxidation treatment was prepared and was examined by the pin-on-disk method in the sliding test. After the test, the φ60 flat sheet sample was checked for a sliding wear scar with an optical microscope and a scanning electron microscope. Table 1 shows the evaluation results.

Evaluation

Exemplary Embodiments 1 to 4 of the disclosure showed that the amount of dust was greatly decreased, no sliding wear scar was observed in the sliding test and the sliding durability was good, and the diamond-like carbon film was not separated. More specifically, in Exemplary Embodiment 1, in which the diamond-like carbon film was formed on the wafer chuck made of the ceramic sintering base containing silicon carbide subjected to oxidation treatment, the amount of dust was greatly decreased (1/100 of Comparative Example 1). Although the diamond-like carbon film was partly separated in the sintering aid portion in the sliding test, no sliding wear scar was observed in the other portion. Thus, the sliding test was at a practically acceptable level.

Exemplary Embodiment 2 showed that the diamond-like carbon film on the polycrystalline silicon carbide member formed by the CVD method was not separated in the sliding test, thus showing good adhesiveness. This is because the polycrystalline silicon carbide member formed by the CVD method without the sintering aid is more resistant to thermal oxidation treatment and has higher adhesiveness to the diamond-like carbon film than sintered bodies. In the wafer chucks including the base made of the ceramic containing silicon carbide sintering, the formation of the adhesive layer (Exemplary Embodiments 3 and 4) further reduces dusting and film separation.

In contrast, in Comparative Example 1, in which the chuck base was not subjected to oxidation treatment and no adhesive layer and no diamond-like carbon film were formed, the amount of dust was increased, and a sliding wear scar was observed in the sliding test, which indicates poor sliding durability. In Comparative Example 2, in which only oxidation treatment was performed, the amount of dust was greatly decreased, but a sliding wear scar was observed in the sliding test, which indicates poor sliding durability.

Exemplary Embodiments 5 and 6

A silicon film or a silicon nitride film was formed as an adhesive layer by a known sputtering method on a φ60 flat sheet sample made of a polycrystalline silicon carbide

TABLE 1

| | Exemplary Embodiment 1 | Exemplary Embodiment 2 | Exemplary Embodiment 3 | Exemplary Embodiment 4 | Comparative Example 1 | Comparative Example 2 |
|---|---|---|---|---|---|---|
| Chuck member | Silicon carbide ceramic sintered body | Polycrystalline silicon carbide formed by CVD method | Silicon carbide ceramic sintered body | Silicon carbide ceramic sintered body | Silicon carbide ceramic sintered body | Silicon carbide ceramic sintered body |
| Oxidation treatment | Heat treatment at 400° C. in the air | Heat treatment at 450° C. in the air | Heat treatment at 400° C. in the air | Heat treatment at 600° C. in the air | | Heat treatment at 400° C. in the air |
| DLC film structure | DLC film monolayer (100 nm) | DLC film monolayer (150 nm) | C—Si—O—H intermediate layer/DLC film | C—Si—O—H intermediate layer/DLC film | | |
| Measured amount of dust | about 1/100 of untreated (Comparative Example 1) | about 1/250 of untreated (Comparative Example 1) | about 1/250 of untreated (Comparative Example 1) | about 1/250 of untreated (Comparative Example 1) | 1 (control) | about 1/200 of untreated (Comparative Example 1) |
| Sliding test results | Partial film separation at sintering aid portion No sliding wear scar except separated portion | No film separation No sliding wear scar | No film separation No sliding wear scar | No film separation No sliding wear scar | Sliding wear scars | Sliding wear scars | formed by the CVD method subjected to processing and oxidation treatment in the same manner as in Exemplary Embodiment 1. A diamond-like carbon film was formed in the samples under the same conditions as in Exemplary Embodiment 3. For these samples, the load condition in the sliding test by the pin-on-disk method was changed to double (100 g). After the test, the samples were checked for a sliding wear scar and film separation with an optical microscope and a scanning electron microscope. The evaluation results showed that the two samples including the silicon film or the silicon nitride film as an adhesive layer had no film separation and no sliding wear scar.

Exemplary Embodiment 7

An amorphous layer containing carbon, silicon, oxygen, and hydrogen was formed with a high-frequency plasma CVD apparatus as illustrated in FIG. 1 as an adhesive layer on a ϕ60 flat sheet sample made of a polycrystalline silicon carbide formed by the CVD method subjected to processing and oxidation treatment in the same manner as in Exemplary Embodiment 1. A diamond-like carbon film was formed on the sample under the same conditions as in Exemplary Embodiment 1. For this sample, the load condition of the pin-on-disk method in the sliding test was changed to double (100 g). After the test, the sample was checked for a sliding wear scar and film separation with an optical microscope and a scanning electron microscope. The evaluation results showed no film separation and no sliding wear scar.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-182530, filed Oct. 2, 2019, and Japanese Patent Application No. 2020-134003, filed Aug. 6, 2020, which are hereby incorporated by reference herein in their entirety.

What is claimed is:

1. A wafer chuck comprising a base made of a ceramic containing silicon carbide and having pin portions,
   wherein the base has an oxidation-treated layer, and a film made of diamond-like carbon (DLC) is formed on an outermost surface of the base having the pin portions, and
   wherein the film includes a portion covering a region of the outermost surface of the base, the region being different from surfaces of the pin portions.

2. The wafer chuck according to claim 1, wherein a layer containing at least silicon or carbon is formed between the oxidation-treated layer and the film.

3. The wafer chuck according to claim 2, wherein the layer containing at least silicon or carbon has a thickness of 0.01 μm or more and 1 μm or less.

4. The wafer chuck according to claim 2, wherein the layer containing at least silicon or carbon is a layer composed mainly of silicon, silicon nitride, silicon carbide, or carbon nitride.

5. The wafer chuck according to claim 1, wherein an amorphous layer containing carbon, silicon, oxygen, and hydrogen is formed between the oxidation-treated layer and the film.

6. The wafer chuck according to claim 5, wherein the amorphous layer containing carbon, silicon, oxygen, and hydrogen has a thickness of 0.01 μm or more and 1 μm or less.

7. The wafer chuck according to claim 5, wherein each of carbon, silicon, and hydrogen atom concentrations in the amorphous layer containing carbon, silicon, oxygen, and hydrogen is 5 atomic percent or more, and an oxygen atom concentration is 20 atomic percent or less.

8. The wafer chuck according to claim 1, wherein the film has a thickness of 0.04 μm or more and 1 μm or less.

9. The wafer chuck according to claim 1, wherein the oxidation-treated layer has an oxygen atom concentration of more than 25 atomic percent.

10. The wafer chuck according to claim 1, wherein the oxidation-treated layer has a thickness ranging from 1 nm to 100 nm.

11. The wafer chuck according to claim 1, wherein the film has a thickness ranging from 0.04 micrometers to 1 micrometers.

* * * * *